United States Patent [19]

Demand

[11] 4,426,619
[45] Jan. 17, 1984

[54] ELECTRICAL TESTING SYSTEM INCLUDING PLASTIC WINDOW TEST CHAMBER AND METHOD OF USING SAME

[75] Inventor: Erhart E. Demand, Boston, Mass.
[73] Assignee: Temptronic Corporation, Newton, Mass.
[21] Appl. No.: 269,868
[22] Filed: Jun. 3, 1981
[51] Int. Cl.³ .................................... G01R 15/12
[52] U.S. Cl. .................. 324/73 PC; 324/158 F
[58] Field of Search ............ 324/73 PC, 158 F, 73 R, 324/73 AT, 158 R, 158 P

[56] References Cited

U.S. PATENT DOCUMENTS 4,172,993 10/1979 Leach ........................ 324/158 F
4,229,693 10/1980 Irick et al. ................. 324/158 F

FOREIGN PATENT DOCUMENTS 2227537 4/1973 France .................... 324/73 PC

OTHER PUBLICATIONS

Kilburn et al., "Module Thermal Test Chamber", IBM Technical Disclosure Bulletin, vol. 24, No. 9, Feb. 1982, pp. 4650–4651.

*Primary Examiner*—Gerard R. Strecker
*Assistant Examiner*—Warren S. Edmonds
*Attorney, Agent, or Firm*—Schiller & Pandiscio

[57] ABSTRACT

An improved system for and method of testing electrical components under temperature controlled conditions includes a chamber, within which the component can be mounted, for maintaining a predetermined environmental temperature for the component. A window forming part of a wall of the chamber includes a plurality of flexible, substantially transparent, spaced-apart sheets of plastic film. Dry gas is forced through the space between adjacent sheets to prevent moisture from forming on the sheets. A probe needle can be inserted through any random point of the window into contact with the component disposed within the chamber.

8 Claims, 4 Drawing Figures

ELECTRICAL TESTING SYSTEM INCLUDING PLASTIC WINDOW TEST CHAMBER AND METHOD OF USING SAME

The present invention relates generally to systems for and methods of testing electrical components, and more particularly to an improved system for and method of testing, under temperature controlled conditions, electrical components with an electrical probe.

It is often desirable to test the performance of electrical components, such as printed circuit boards, throughout a range of temperature to insure the accuracy of the components. Several systems and techniques are known for accomplishing such tests. One such system and technique employs a chamber including a glass or plastic window, and fixed access ports. The ports are open so that a probe needle can be inserted through each port into the chamber, into contact with the printed circuit board. However, it can be difficult, if not impossible, to extend the probe needle into contact with certain points on some printed circuit boards due to the limited number of ports. If these ports are large to provide greater access, temperature control over the board surface will be adversely affected.

Another approach to overcome this problem is to wire predetermined test points on the printed circuit board to points outside the chamber. However, if all possible test points are wired, frequently there are too many such points to be practical. If only some points are wired, random access to all possible points then becomes unavailable. Further, for some electrical testing, extra wire length can affect the tests results.

A third approach is to provide a chamber having a temperature controlled environment with an access door which can be quickly opened and closed for electrical probing. However, by opening and closing the access door with each probe, the temperature environment is easily affected. Further, when the temperature within the chamber is initially set below the test room ambient dew point, moisture can condense on the test object during door openings, which in turn can adversely affect some electrical tests.

A solution to the foregoing is to utilize a single plastic film which is tautly held over a frame to form the window of the chamber. A needle probe can then be randomly inserted through any point in the plastic window into contact with the printed circuit board. However, for temperatures in the chamber substantially above or below room temperature (for example, differential temperatures greater than 10° C.) heat transfer can occur through the plastic film affecting the temperature within the chamber making temperature stability difficult. Further, where the temperature within the chamber is below the test room ambient dew point, condensation can occur on the single plastic sheet.

It is an object of the present invention to provide an improved system for and method of testing electrical components under temperature controlled conditions, which overcomes or substantially reduces the above-noted problems.

More specific objects of the present invention are to provide an improved system for and method of testing electrical components in which the components are clearly visible from outside the chamber during testing conditions; the electrical component mounted within the chamber can be easily probed at any random point, without opening the chamber and without appreciably affecting the temperature conditions within the chamber; and no moisture forms on the window affecting visibility regardless of whether the temperature within the chamber is below the test room ambient dew point.

These and other objects are achieved by an improved system for and method of testing electrical components. The system includes a chamber adapted to maintain a temperature controlled environment. The chamber includes a window defining at least a part of the chamber. The window comprises a plurality of flexible, juxtaposed, substantially transparent plastic sheets each mounted so that the sheets are substantially taut and adjacent sheets have a spacing therebetween. Means are provided for mounting the component in the chamber adjacent the window. Probe means includes a probe needle adapted to be pushed from a position external to the chamber, through the window, puncturing the sheets and brought into contact with any random point of the component without appreciably affecting the temperature within the chamber.

Means are also provided for forcing a dry gas through each spacing between adjacent sheets. As used herein the term "dry gas" shall mean any gas (including air) with a dew point temperature lower than the surface temperature of the window sheet from which condensation is to be precluded.

The method of the present invention is for electrically testing an electrical component mounted within a chamber. The chamber is of the type for maintaining a temperature controlled environment for the component and includes a window comprising a plurality of flexible, juxtaposed, plastic, substantially transparent sheets each mounted so as to be taut and so as to form a space between each pair of adjacent sheets. The method comprises the steps of forcing a dry gas through each of the spaces so as to prevent moisture from condensing on the sheets; and inserting a probe needle through the sheets into contact with the electrical component without appreciably affecting the temperature within the chamber.

Other objects of the present invention will in part be obvious and will in part appear hereinafter. The invention, accordingly, comprises the apparatus possessing the construction, combination of elements, and arrangement of parts, and the processes involving the several steps and the relation and order of one or more of such steps with respect to each of the others, which are exemplified in the following detailed disclosure and the scope of the application all of which will be indicated in the claims.

For a fuller understanding of the nature and objects of the present invention, reference should be had to the accompanying drawings wherein.

In the drawings the same numerals are used to designate similar or like parts.

Figure 1:
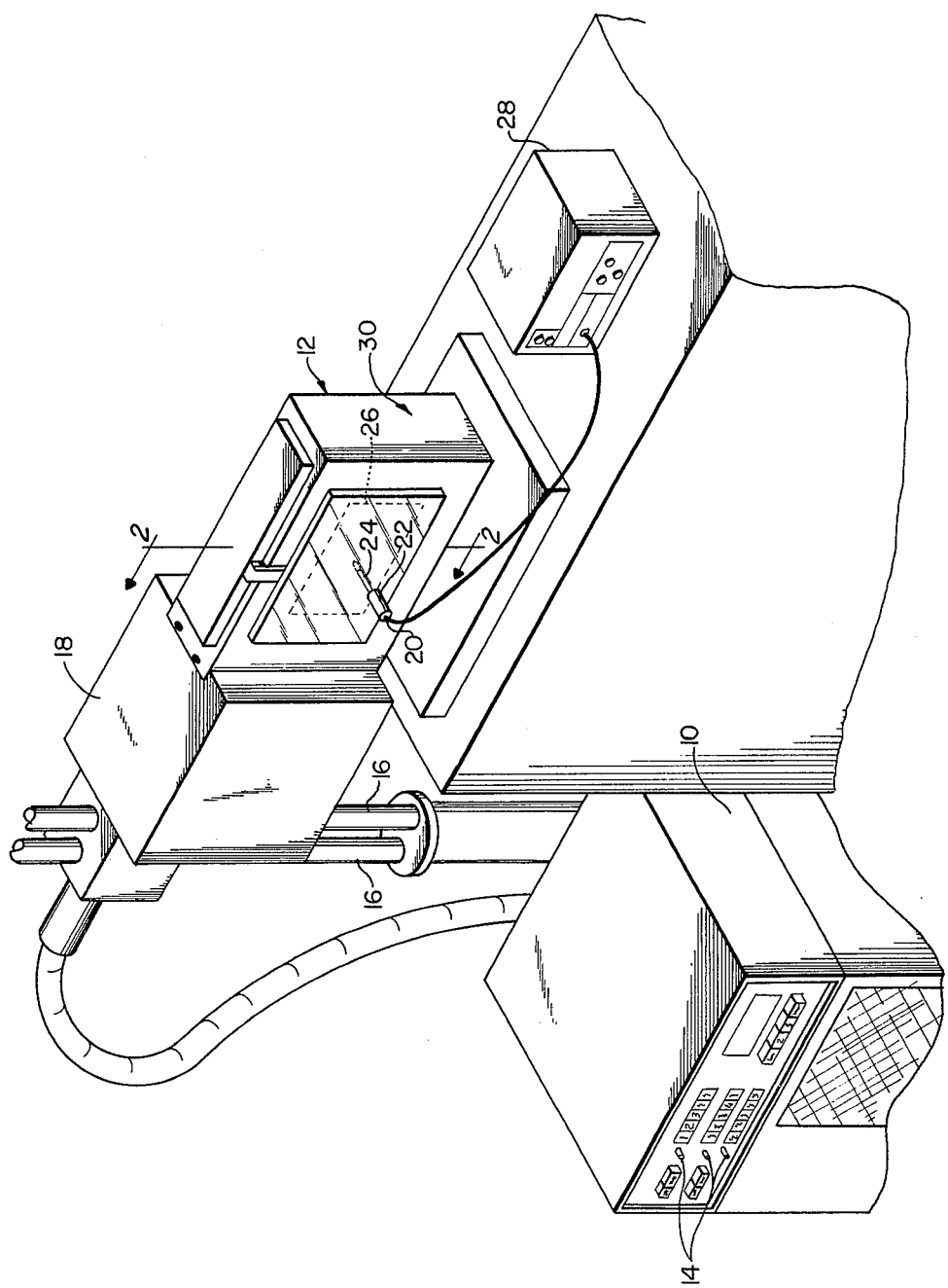
FIG. 1 is a perspective view, partially cut away, of the testing apparatus of the present invention.

Referring to FIG. 1 the system includes a controller and refrigeration unit 10 for controlling the heating or cooling of the interior of chamber 12 to a preselected temperature set by the external controls 14 provided on the outside of unit 10. Unit 10 includes support poles 16 for supporting the heat exchanger unit 18 for selectively heating or cooling the chamber 12. The chamber 12 is secured to unit 18 so that chamber 12 can be easily raised or lowered with unit 18. The system of the present invention further includes probe means including the probe 20 comprising a handle 22 for holding the probe and a probe needle 24. Needle 24 can be any size, with a 1/16 inch diameter being typical. The probe 20 is suitably electrically connected to the electrical processing system 28 for processing electrical signals generated when probe needle 24 contacts the electrical component 26 mounted within chamber 12.

Figure 2:
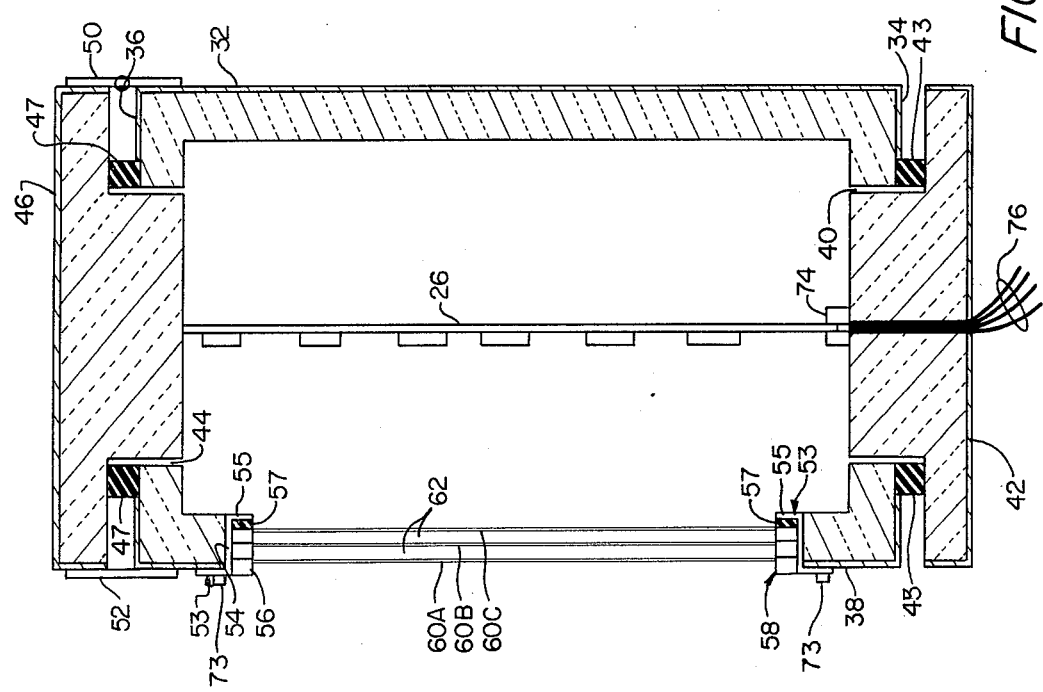
FIG. 2 is a cross-sectional view taken along line 2—2 of FIG. 1.

The preferred chamber 12, shown in greater detail in FIG. 2, includes an open end (not shown in the drawings) communicating with heat exchanger unit 18. Chamber 12 also includes an end wall 30 opposite its open end (as shown in FIG. 1), a rear wall 32, bottom and top walls 34 and 36, respectively, and front wall 38. Bottom wall 34 is provided with an opening 40 for receiving the bottom support 42 in a snug fitting relation. A gasket 43 is provided between bottom wall 38 and bottom support 42 so as to insure a seal between the two or prevent heat transfer through opening 40 when operating the system. The opening 40 receives support 42 in such a way that when testing components at temperatures above room temperature the chamber can be raised with respect to support 42 so that a tested component can be removed, a new component mounted on the support in a manner which will be more evident hereinafter, and the chamber lowered back down onto support 42. Top wall 36 is provided with a similar opening 44 for receiving the top lid 46 suitably mounted to the top of the chamber and a gasket 47 is provided between wall 36 and lid 46 for reasons similar to gasket 43. Lid 46 is suitably mounted to the top of the chamber with hinge 50 provided on one side of the lid and a latch 52 on the other side of the lid for snugly securing the lid in a closed position. The lid can thus be readily opened and components substituted when testing components at temperatures below room temperature. Front wall 38 includes opening 54. A bracket 53, suitably secured to front wall 38 (such as securing the bracket to the wall with a suitable epoxy cement), extends around the perimeter of opening 54. Bracket 53 includes a flange 55 around the perimeter of opening 54. The latter is closed off by the window 56. A gasket 57 is provided between the window 56 and flange 55 to insure that no heat exchange occurs through opening 54 when operating the system. The chamber 12 including the bottom support 42 as well as lid 46, while excluding window 56, is generally formed with an outer metal casing and an inner, relatively thick layer of heat insulative material.

The window 56 includes a frame assembly 58 for supporting a plurality of sheets 60 of flexible, substantially transparent film. Sheets 60 are mounted so that each is taut or in tension, juxtaposed with respect to one another, in a substantially parallel relationship so as to provide a space 62 between each pair of adjacent sheets. The number of sheets and the materials and thickness of each sheet utilized is largely dependent upon the temperature range to which the interior of chamber 12 is expected to be exposed and in particular the expected temperature at which each sheet is exposed. For example, where the expected range of temperatures is between +70° C. and −60° C., a three mil thick polyethylene sheet can be used for each sheet 60 and three sheets spaced approximately 0.6 cm apart are believed adequate. However, each sheet can be made of a different material and/or be of a different thickness since each sheet is subjected to a different temperature. Specifically, the outer sheet 60A will be approximately at room temperature, while the inner most sheet 60C is at the interior temperature of the chamber. The middle sheet 60B will operate at a temperature between the room and inner chamber temperatures.

Figure 4:
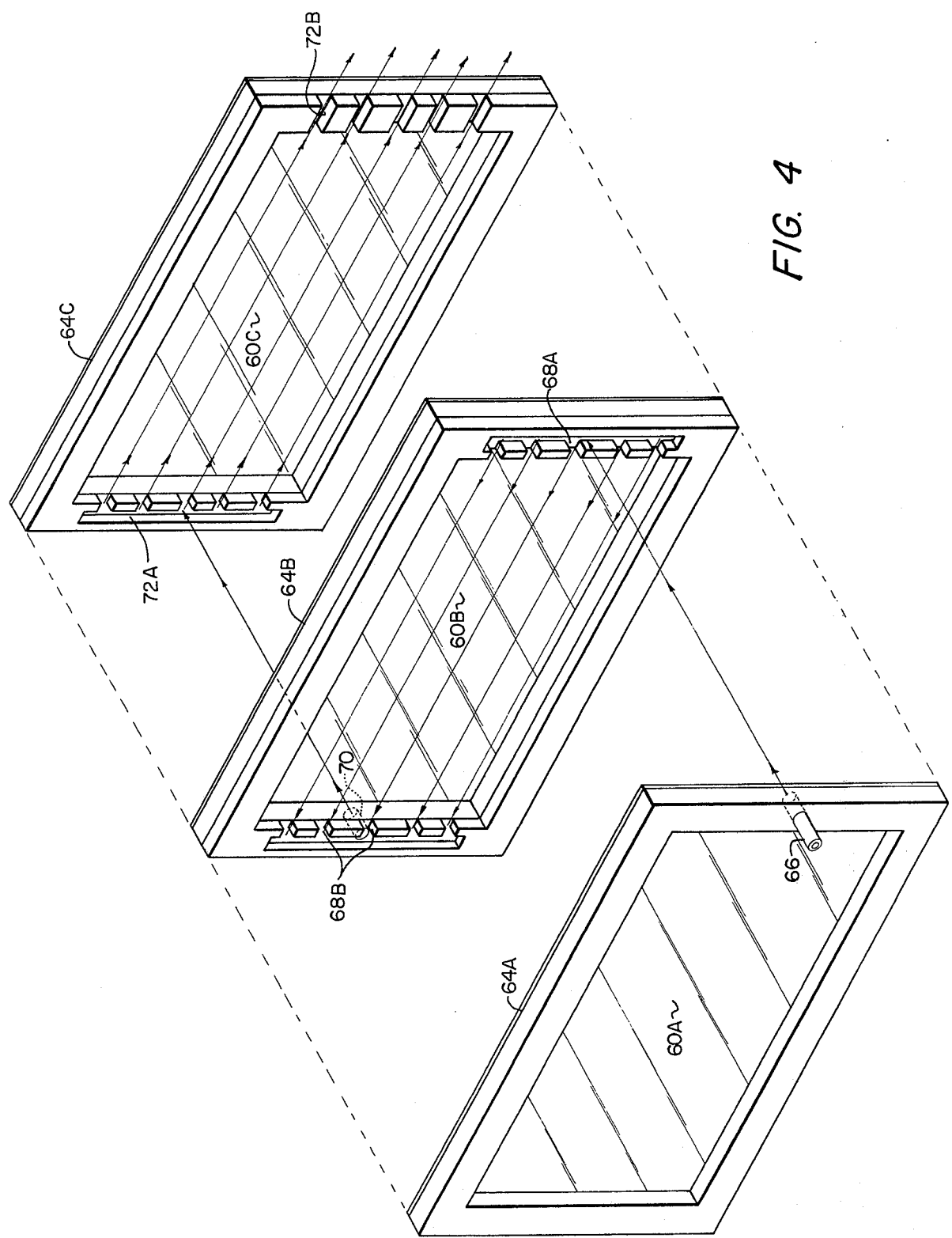
FIG. 4 is an exploded perspective view of the preferred embodiment of the window of the system of FIG. 1.

As best shown in FIG. 4 the assembly 58 preferably includes a plurality of frame members 64 for respectively supporting the corresponding sheets 60. The sheet can be mounted in any suitable manner such as clamping each sheet to a corresponding frame member. Frame members 64 are preferably provided with a suitable input for the introduction of a dry gas into the spaces 62, conduit means for transmitting dry gas through the spaces and an output for exhausting the dry gas. Preferably, the dry gas input is in the form of a hose 66 connected to an opening in one side of the outer frame member 64A, the opening communicating with the space 62A between sheets 60A and 60B. Slots 68 are formed on opposite ends of one side of middle frame member 64B, ie., that side contacting frame member 64A so that slots are provided at each of the opposite sides of the space 62A. An aperture 70 is formed in the side of intermediate member 64B opposite the side of member 64A provided with hose 66. Slots substantially identical to that of frame member 64B, are also formed in the side of inner member 64C at each of the opposite sides of the space 62B, with the slots 72B formed on the side of the assembly 58 opposite the aperture 70 providing an exhaust for the dry gas. In use, a dry gas, such as 0.5 cfm dry nitrogen or dry air, is provided through hose 66 at a pressure, for example, at 2.0±0.5 Kg/cm². The entire window is secured to the front of chamber 12 by any suitable means, such as screws 73 securing bracket 55 to window frame assembly 38, covering opening 54, so as to form a part of the front wall 38 and so as to provide a relatively tight closure to prevent air and heat transfer therethrough.

Finally, as shown in FIG. 2, suitable means are provided for mounting the electrical component 26 in a stationary manner within the chamber 12, adjacent to window 56. Preferably, component support guides (not shown for supporting the opposite side edges of each component 26 can be respectively provided near end wall 30 and the open end formed with chamber 12 communicating with exchanger unit 18. A bottom edge connector 74 supports the bottom edge of each component 26. The edge connector 74 connects appropriate electrical signal points on the electrical component 26, via wires 76 suitably mounted through support 42, to processing system 28.

In use a dry gas such as 0.5 cfm dry nitrogen or dry air is provided through hose 66 at a pressure, for example, of 2.0±0.5 kg/cm². The dry gas is forced through slots 68A on one side of space 62A through that space to the slots 68B at the other side of the space. The gas is then forced through aperture 70 to the slots 72A, through space 62B out the exhaust slots 72B. The dry gas has a dew point lower than the temperature of sheet 60C so that little or no moisture forms on sheet 60C. Also the dry gas, when it passes through space 62A is sufficiently warm so that it does not cool the film 60A below its dew point. When air is introduced from the outside, as described in the preferred embodiment of the present invention, it is at room temperature. The portions of frames 64B and 64C provided with the respective slots 68B and 72A, in particular, also serve as heat exchangers for the dry gas to bring the gas more closely to the control temperature inside the chamber.

Figure 3:
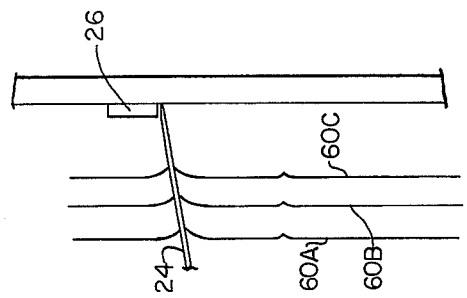
FIG. 3 shows the probe needle of the FIG. 1 system inserted through the window into contact with a point of an electrical component suitably mounted within the chamber of the system of FIG. 1.

As shown in FIGS. 1, 2, and 3, when testing component 26, the probe handle 22 can be held and probe needle 24 can be pushed through sheets 60 at any random point, puncturing the sheets and moved into contact with the component lead so that the response of the component can be treated with processing system 28. The smaller the diameter of the probe needle; the smaller the gas leak into or out of the test chamber. Even dozens of 1/16 inch diameter holes have a negligible effect on chamber performance of maintaining a predetermined temperature.

Although the invention has been described in its preferred mode, various changes may be made in the described embodiment without departing from the invention. For example, although the dry gas passes between sheets 60 serially from space 62A to space 62B to the outside, the window can be constructed so that the gas can flow in the opposite direction. The window can also be constructed so that the gas simultaneously flows through and exits from the spaces 62A and 62B. If the gas is at the predetermined temperature of the chamber, it can be introduced into chamber 12 and flow serially or simultaneously through spaces 62A and 62B and exhausted to the atmosphere.

Since certain other changes may be made in the above apparatus and methods without departing from the scope of the invention herein involved, all matter contained in the above description shall be interpreted in an illustrative and not in a limited sense.

What is claimed is:

1. A system for electrically testing an electrical component under temperature controlled conditions, said system comprising, in combination:
    a chamber adapted to maintain a temperature controlled environment;
    a window defining at least a part of said chamber and comprising a plurality of flexible, juxtaposed, substantially transparent plastic sheets each mounted so that said sheets are substantially taut and adjacent sheets have a spacing therebetween;
    means cooperating with the chamber for forcing a dry gas through each of said spacings between adjacent sheets so as to prevent moisture from condensing on said sheets;
    means disposed in said chamber for mounting said component in said chamber adjacent said window; and
    probe means including a probe needle adapted to be pushed from a position outside said chamber, through said window puncturing said sheets, into contact with said component, without appreciably affecting the temperature within said chamber.

2. A system according to claim 1, further including means for forcing said dry gas through said spacings between said sheets.

3. A system according to claim 2, further including a frame assembly for supporting said sheets tautly, and said means for forcing dry gas through said spacing includes an input for receiving dry gas from a pressurized source of said gas, an output for venting said dry gas from said window, and conduit means disposed in said frame for defining the flow of said gas from said input, through said spacings to said output.

4. A system according to claim 3, wherein said conduit means includes slots formed in said frame assembly at two opposite edges of each spacing and means formed in said window assembly for providing fluid communication between adjacent spacings.

5. A system according to claim 2, wherein each of said sheets is made of a material dependent upon the expected temperature at which said sheet is to be exposed when the temperature within said chamber is set at a predetermined level different from the temperature outside said chamber.

6. A system according to claim 2, wherein each of said sheets has a thickness dependent upon the expected temperature at which said sheet is to be exposed when the temperature within said chamber is set at a predetermined level different from the temperature outside said chamber.

7. A method of electrically testing an electrical component with a testing system of the type including an electrically conductive probe needle when the component is mounted within a chamber of the type for maintaining a temperature controlled environment for said electrical component and including a window comprising a plurality of flexible, juxtaposed, plastic, substantially transparent sheets each mounted so as to be taut and so as to form a space between each pair of adjacent sheets, said method comprising the steps of:
    forcing a dry gas through each of said spaces so as to prevent moisture from condensing on said sheets; and
    inserting said probe needle through said sheet into contact with said electrical component without substantially affecting the temperature within said chamber.

8. A method according to claim 7, wherein said step of inserting includes the step of puncturing said sheets with said probe needle.

* * * * *